(12) United States Patent
Moon et al.

(10) Patent No.: US 9,142,597 B2
(45) Date of Patent: Sep. 22, 2015

(54) ORGANIC LIGHT EMITTING DIODE DISPLAY

(71) Applicant: Samsung Display Co., Ltd., Yongin, Gyeonggi-Do (KR)

(72) Inventors: Ji-Hye Moon, Yongin (KR); Kyu-Seok Kim, Yongin (KR); Young-Nam Yun, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/134,196

(22) Filed: Dec. 19, 2013

(65) Prior Publication Data
US 2014/0319483 A1 Oct. 30, 2014

(30) Foreign Application Priority Data
Apr. 26, 2013 (KR) ........................ 10-2013-0046779

(51) Int. Cl.
*H01L 29/08* (2006.01)
*H01L 27/32* (2006.01)
*H01L 51/00* (2006.01)

(52) U.S. Cl.
CPC ........ *H01L 27/3241* (2013.01); *H01L 51/0097* (2013.01); *H01L 2251/558* (2013.01); *Y02E 10/549* (2013.01)

(58) Field of Classification Search
CPC ............ H01L 27/3241; H01L 51/0097; H01L 2251/558
USPC ......... 257/40, 89, 98; 313/504, 506, 498, 503
See application file for complete search history.

(56) References Cited

U.S. PATENT DOCUMENTS

| 5,554,911 | A | * | 9/1996 | Nakayama et al. | 313/504 |
|---|---|---|---|---|---|
| 6,274,979 | B1 | * | 8/2001 | Celii et al. | 313/506 |
| 7,247,394 | B2 | * | 7/2007 | Hatwar et al. | 428/690 |
| 7,259,514 | B2 | * | 8/2007 | Murayama et al. | 313/506 |
| 7,750,559 | B2 | * | 7/2010 | Furugori | 313/504 |
| 8,076,841 | B2 | * | 12/2011 | Shiobara et al. | 313/504 |
| 8,288,784 | B2 | * | 10/2012 | Cho | 257/89 |
| 8,940,568 | B2 | * | 1/2015 | Mohan et al. | 438/46 |
| 2007/0057264 | A1 | * | 3/2007 | Matsuda | 257/88 |
| 2007/0096130 | A1 | * | 5/2007 | Schiaffino et al. | 257/98 |
| 2007/0296334 | A1 | * | 12/2007 | Matsuda | 313/506 |
| 2008/0111474 | A1 | * | 5/2008 | Sung et al. | 313/504 |
| 2009/0026921 | A1 | * | 1/2009 | Kuma et al. | 313/504 |
| 2010/0156280 | A1 | * | 6/2010 | Song et al. | 313/504 |
| 2011/0031515 | A1 | * | 2/2011 | Mizuno et al. | 257/89 |

(Continued)

FOREIGN PATENT DOCUMENTS

| JP | 2010-146738 A | 7/2010 |
|---|---|---|
| KR | 10-2011-0029311 A | 3/2011 |
| KR | 10-2012-0053340 A | 5/2012 |

*Primary Examiner* — Charles Garber
*Assistant Examiner* — Ankush Singal
(74) *Attorney, Agent, or Firm* — Robert E. Bushnell, Esq.

(57) ABSTRACT

An organic light emitting diode (OLED) display includes a substrate including a central area and a peripheral area adjacent the central area and bent at the center thereof, a first central OLED disposed on the central area of the bent substrate and including a first central organic emission layer having a first central thickness, and a first surrounding OLED disposed on the peripheral area of the bent substrate and including a first surrounding organic emission layer having a first surrounding thickness.

15 Claims, 6 Drawing Sheets

(56) References Cited

U.S. PATENT DOCUMENTS

| | | | |
|---|---|---|---|
| 2011/0180825 A1* | 7/2011 | Lee et al. | 257/89 |
| 2013/0119352 A1* | 5/2013 | Aurongzeb | 257/40 |
| 2013/0320308 A1* | 12/2013 | Lee et al. | 257/40 |
| 2014/0065750 A1* | 3/2014 | Harikrishna Mohan et al. | 438/35 |
| 2014/0077688 A1* | 3/2014 | Weaver et al. | 313/504 |
| 2014/0151658 A1* | 6/2014 | Lee et al. | 257/40 |
| 2014/0167013 A1* | 6/2014 | Lee et al. | 257/40 |
| 2014/0291627 A1* | 10/2014 | Kim et al. | 257/40 |
| 2014/0361958 A1* | 12/2014 | Cho et al. | 345/76 |
| 2015/0014661 A1* | 1/2015 | Joo et al. | 257/40 |

* cited by examiner (a)

(b)

(a)

(b)

ORGANIC LIGHT EMITTING DIODE DISPLAY

CLAIM OF PRIORITY

This application claims priority to and the benefit of Korean Patent Application No. 10-2013-0046779 filed in the Korean Intellectual Property Office on Apr. 26, 2013, the entire contents of which are incorporated herein by reference.

BACKGROUND OF THE INVENTION

1. Field of the Invention

The described technology relates generally to an organic light emitting diode (OLED) display. More particularly, the described technology relates to an OLED display including a bent substrate.

2. Description of the Related Art

Recently, organic light emitting diode (OLED) displays have attracted attention as a display device.

OLED displays are self-emissive, thin and light, as no light source is required, unlike liquid crystal displays (LCDs). Furthermore, OLED displays have excellent characteristics such as low power consumption, high luminance, fast response time, etc.

OLED displays include a substrate and an organic light-emitting element disposed on the substrate. The organic light-emitting element includes a first electrode, an organic emission layer and a second electrode, which are sequentially laminated.

Recently, an organic light-emitting element has been developed. This organic light-emitting element is constructed in such a manner that light emitted from an organic emission layer is reflected plural times between a first electrode and a second electrode to cause constructive interference corresponding to a set wavelength in light emitted from the organic emission layer by controlling the thickness of the organic emission layer in response to the wavelength of light emitted from the organic light-emitting element to adjust the distance between the first electrode and the second electrode.

However, when the substrate of the OLED display including the above-described organic light emitting element is bent, the organic light emitting element is tilted at a predetermined angle according to the curvature of the bent substrate and thus the distance between the first electrode and the second electrode of the tilted organic light-emitting element is changed on the front side of the bent substrate. Accordingly, the wavelength of light emitted from the tilted organic light-emitting element is varied on the front side of the bent substrate, causing inaccurate color reproduction.

The above information disclosed in this background section is only for enhancement of understanding of the background of the described technology and therefore it may contain information that does not form the prior art that is already known to a person of ordinary skill in the art.

SUMMARY OF THE INVENTION

The described technology has been made in an effort to provide an OLED display having advantages of allowing light emitted from an organic light-emitting element to be visually recognized as a predetermined color even if the organic light-emitting element including a bent substrate is tilted.

An embodiment of the present invention provides an organic light emitting diode (OLED) display that includes a substrate including a central area and a peripheral area adjacent the central area and bent at the center thereof, a first central OLED disposed on the central area of the bent substrate and including a first central organic emission layer having a first central thickness, and a first surrounding OLED disposed on the peripheral area of the bent substrate and including a first surrounding organic emission layer having a first surrounding thickness.

The first central OLED may further include a first central bottom electrode and a first central top electrode facing each other, with the first central organic emission layer disposed therebetween, and the first surrounding OLED may further include a first surrounding bottom electrode and a first surrounding top electrode facing each other, with the first surrounding organic emission layer disposed therebetween.

The distance between the first central bottom electrode and the first central top electrode along a virtual vertical line may be identical to the distance between the first surrounding bottom electrode and the first surrounding top electrode along the virtual vertical line.

The first central bottom electrode and the first surrounding bottom electrode may be light reflective and the first central top electrode and the surrounding top electrode may be transflective.

The first central top electrode and the surrounding top electrode may be integrated with each other.

The first central bottom electrode and the first central top electrode may come into contact with the first central organic emission layer and the first surrounding bottom electrode and the surrounding top electrode may come into contact with the first surrounding organic emission layer.

The first central organic emission layer and the surrounding organic emission layer may emit light having the same color.

The first central organic emission layer may include a central assistant layer having a central assistant thickness and the first surrounding organic emission layer may include a surrounding assistant layer having a surrounding assistant thickness less than the central assistant thickness.

Each of the central assistant layer and the surrounding assistant layer may include at least one of a hole injection layer, a hole transport layer, a hole blocking layer, an electron transport layer, an electron injection layer and an electron blocking layer.

The OLED display may further include a second central OLED neighboring the first central OLED and including a second central organic emission layer having a second central thickness less than the first central thickness, a third central OLED neighboring the second central OLED and including a third central organic emission layer having a third central thickness less than the second central thickness, a second surrounding OLED neighboring the first surrounding OLED and including a second surrounding organic emission layer having a second surrounding thickness less than the first surrounding thickness, and a third surrounding OLED neighboring the second surrounding OLED and including a third surrounding organic emission layer having a third surrounding thickness less than the second surrounding thickness.

The first central organic emission layer and the first surrounding organic emission layer may emit red light, the second central organic emission layer and the second surrounding organic emission layer may emit green light and the third central organic emission layer and the third surrounding organic emission layer may emit blue light.

The first central organic emission layer, the first surrounding organic emission layer, the second central organic emission layer, the second surrounding organic emission layer, the third central organic emission layer and the third surrounding organic emission layer may emit white light.

The first central OLED and the first surrounding OLED may emit red light, the second central OLED and the second surrounding OLED may emit green light and the third central OLED and the third surrounding OLED may emit blue light.

The peripheral area may be located higher than the central area.

The central area may be located higher than the peripheral area.

In another aspect of the embodiment, provided herein is an OLED display that includes a substrate including a central area and a peripheral area adjacent the central area and bent at the center thereof, and a plurality of OLEDs disposed on the bent substrate over the central area to the peripheral area and including organic emission layers having thicknesses gradually decreasing such that an OLED disposed in the central area is thicker than an OLED disposed in the peripheral area.

The organic emission layers included in the plurality of OLEDs may emit light having the same color.

According to one of the embodiments, even if OLEDs including the bent substrate are tilted, light emitted from the tilted OLEDs is recognized as light having a predetermined color.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1:
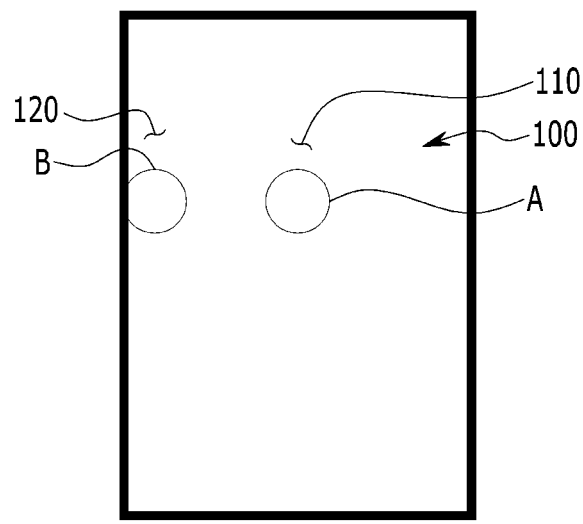
FIG. 1 illustrates an OLED display constructed as a first embodiment according to the principles of the present invention.
Figure 1:
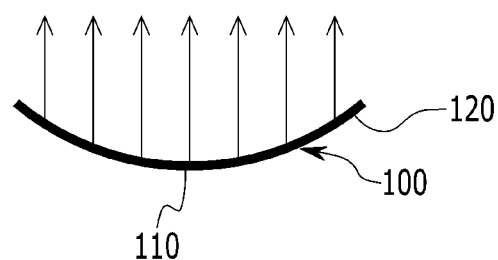

The exemplary embodiment will be described more fully hereinafter with reference to the accompanying drawings, in which exemplary embodiments are shown. The described embodiments may be modified in various different ways, all without departing from the spirit or scope of the present invention.

For clarity of description of the present invention, parts unrelated to description are omitted, and the same reference numbers will be used throughout this specification to refer to the same or like parts.

Components having the same configuration in embodiments will be described using the same reference numbers in a first embodiment, and will be used throughout embodiments to refer to the same parts, and a first embodiment will be described and only parts different from those of the first embodiment will be explained in other embodiments.

In the drawings, dimensions and thicknesses of components are exaggerated, omitted or schematically illustrated for clarity and convenience of description. In addition, dimensions of constituent elements do not entirely reflect actual dimensions thereof.

In the drawings, the thickness of layers, films, panels, regions, etc., are exaggerated for clarity. In the drawings, dimensions of layers are exaggerated for clarity and convenience of description. It will be understood that when an element is referred to as being "on" another element, it can be directly on the other element or intervening elements may be present therebetween.

In addition, unless explicitly described to the contrary, the word "comprise" and variations such as "comprises" or "comprising", will be understood to imply the inclusion of stated elements but not the exclusion of any other elements. Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

An OLED display according to a first embodiment will now be described with reference to FIGS. 1, 2 and 3.

FIG. 1 illustrates an OLED display 1000 constructed as the first embodiment according to the principles of the present invention. FIG. 1(a) is a top plan view of the OLED display and FIG. 1(b) is a side view of the OLED display.

As shown in FIG. 1, the OLED display 1000 according to the first embodiment includes a bent substrate 100 and a plurality of OLEDs formed on the bent substrate 100.

The bent substrate 100 includes a central area 110 and a peripheral area 120 and has a curved shape. The bent substrate 100 is a transmissive insulating substrate formed of glass, polymers or metals. The plural OLEDs are disposed on the bent substrate 100 and a pixel circuit including two or more thin film transistors and one or more capacitors may be formed between the OLEDs and the bent substrate 100. The pixel circuit may be formed in various known forms. An encapsulation part for encapsulating the OLEDs with the bent substrate 100 may be formed on the bent substrate 100. The substrate 100 is bent in a concave form and thus the peripheral area 120 of the bent substrate 100 is positioned higher than the central area 110 of the substrate. For example, the bent substrate 100 has first and second tangent planes. The first tangent plane that has a first point of tangency located in the central area 110 and the second tangent plane that has a second point of tangency located in the peripheral area 120 intersect with each other. That is, the peripheral area 120 is spaced apart from the first tangent plane. The bent substrate 100 may be flexible and thus the OLED display 1000 may also be flexible.

The plural OLEDs disposed on the bent substrate 100 will now be described with reference to FIGS. 2 and 3.

Figure 2:
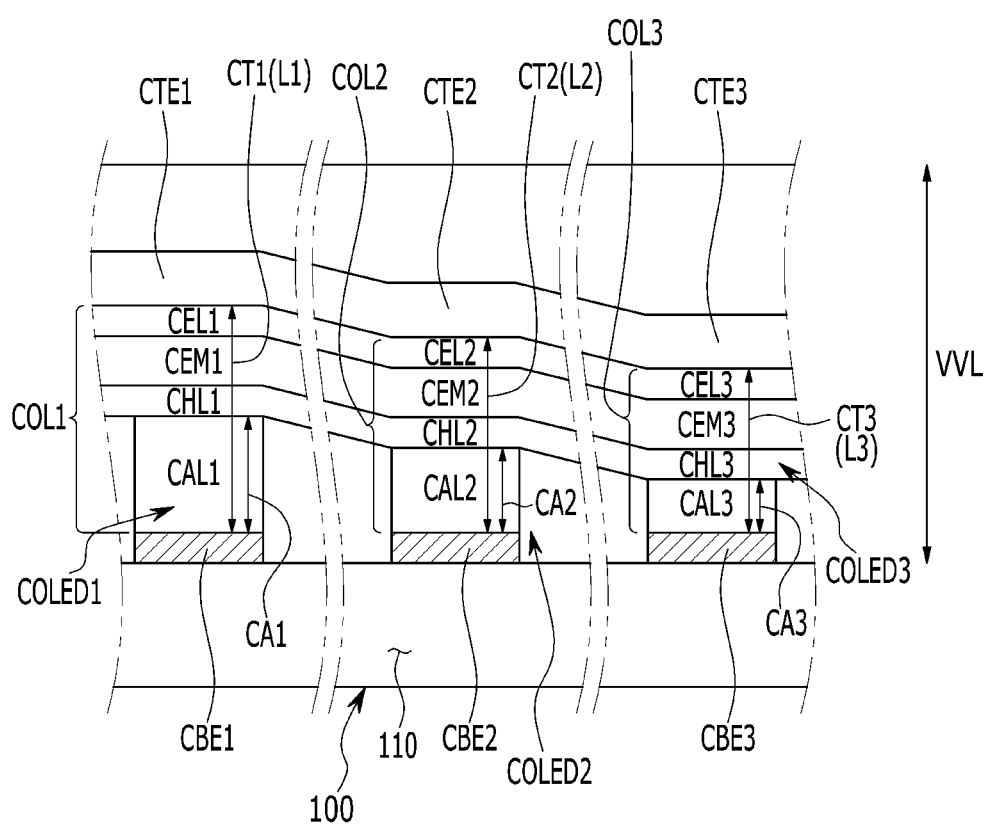
FIG. 2 is a cross-sectional view showing principal components of the OLED display according to the first embodiment, which correspond to region A of FIG. 1.

FIG. 2 is a cross-sectional view showing principal components of the OLED display, which correspond to region A of FIG. 1, according to the first embodiment.

As shown in FIG. 2, the OLED display 1000 according to the first embodiment includes a first central OLED COLED1, a second central OLED COLED2 and a third central OLED COLED3 disposed on the central area 110 of the bent substrate 100.

The first central OLED COLED1 is disposed on the central area 110 of the bent substrate 100 and includes a first central bottom electrode CBE1, a first central top electrode CTE1 and a first central organic emission layer COL1.

The first central bottom electrode CBE1 is disposed on the bent substrate 100 and formed as a light reflective electrode. The first central bottom electrode CBE1 may contain a conductive material such as Ag, Al, indium tin oxide (ITO), indium zinc oxide (IZO) or the like and function as an anode of the first central OLED COLED1.

The first central top electrode CTE1 is disposed opposite the first central bottom electrode CBE1 having the first central organic emission layer COL1 interposed therebetween and formed as a light transmissive electrode. The first central top electrode CTE1 may contain a conductive material such as Ag, Al, ITO, IZO or the like and function as a cathode of the first central OLED COLED1.

In another embodiment, the first central bottom electrode may be formed as a transflective electrode functioning as a cathode and the first central top electrode may be formed as a light reflective electrode serving as an anode.

The first central organic emission layer COL1 is disposed between the first central bottom electrode CBE1 and the first central top electrode CTE1 and has a first central thickness CT1. The first central organic emission layer COL1 comes into contact with the first central bottom electrode CBE1 and the first central top electrode CTE1. Since the first central organic emission layer COL1 comes into contact with the first central bottom electrode CBE1 and the first central top electrode CTE1 while having the first central thickness CT1, the distance between the first central bottom electrode CBE1 and the first central top electrode CTE1 along a virtual vertical line VVL corresponds to a first length L1. The first length L1 is a distance for causing micro cavity effect in light emitted from the first central organic emission layer COL1. Since a degree of bending of the bent substrate 100 is relative small comparing to the dimension of the first central OLED COLED1, the bending of the first central organic emission layer COL1, the first central bottom electrode CBE1, and the first central top electrode CTE1 of the first central OLED COLED1 may be negligible. That is, the first central bottom electrode CBE1 and the first central top electrode CTE1 may be still relatively flat comparing to the bent substrate 100, and may be still parallel to each other. In this case, the virtual vertical line VVL is a line that is perpendicular to the first central bottom electrode CBE1.

The first central organic emission layer COL1 emits red light and includes a first central assistant layer CAL1, a first central bottom organic layer CHL1, a first central main emission layer CEM1 and a first central top organic layer CEL1, which are sequentially laminated on the first central bottom electrode CBE1.

While the first central organic emission layer COL1 emits red light in the first embodiment, the first central organic emission layer COL1 of an OLED display according to another embodiment can emit green, blue or white light.

The first central assistant layer CAL1 may include a hole injection layer (HIL) for injecting holes from the first central bottom electrode CBE1 into the first central bottom organic layer CHL1 to function as the hole injection layer and has a first central assistant thickness CA1. Since the first central assistant layer CAL1 has the first central assistant thickness CAL the first central organic emission layer COL1 has the first central thickness CT1. That is, the first central thickness CT1 of the first central organic emission layer COL1 can be controlled by adjusting the first central assistant thickness CA1 of the first central assistant layer CAL1.

The first central bottom organic layer CHL1 includes a hole injection layer (HIL), a hole transport layer (HTL) and a hole blocking layer (HBL).

The first central main emission layer CEM1 includes an emission layer that emits red light according to combination of holes and electrons respectively injected from the first central bottom electrode CBE1 and the first central top electrode CTE1.

The first central top organic layer CEL1 includes an electron injection layer (EIL), an electron transport layer (ETL) and an electron blocking layer (EBL).

While the first central assistant layer CAL1 includes the hole injection layer in the first embodiment, the first central assistant layer CAL1 of an OLED display according to another embodiment may include one or more of the hole injection layer (HIL), hole transport layer (HTL), hole blocking layer (HBL), electron injection layer (EIL), electron transport layer (ETL) and electron blocking layer (EBL).

Since the first central bottom electrode CBE1 of the first central OLED COLED1 is formed as a light reflective electrode, the first central top electrode CTE1 thereof is formed as a transflective electrode and the distance between the first central bottom electrode CBE1 and the first central top electrode CTE1 corresponds to the first length L1 along the virtual vertical line VVL, light emitted from the first central organic emission layer COL1 is reflected plural times between the first central bottom electrode CBE1 and the first central top electrode CTE1. Accordingly, constructive interference occurs in light emitted from the first central organic emission layer COL1, causing micro cavity effect in the light emitted from the first central organic emission layer COL1. That is, the first central OLED COLED1 emits light having micro cavity.

The second central OLED COLED2 is disposed on the central area 110 of the bent substrate 100 adjacent the first central OLED COLED1 and includes a second central bottom electrode CBE2, a second central top electrode CTE2 and a second central organic emission layer COL2.

The second central bottom electrode CBE2 is disposed on the bent substrate 100 and formed as a light reflective electrode. The second central bottom electrode CBE2 may contain a conductive material such as Ag, Al, ITO, IZO or the like and function as an anode of the second central OLED COLED2. The second central bottom electrode CBE2 is spaced apart from the first central bottom electrode CBE1.

The second central top electrode CTE2 is disposed opposite the second central bottom electrode CBE2 having the second central organic emission layer COL2 interposed therebetween and formed as a light transmissive electrode. The second central top electrode CTE2 may contain a conductive material such as Ag, Al, ITO, IZO or the like and function as a cathode of the second central OLED COLED2. The second central top electrode CTE2 may be integrated with the first central top electrode CTE1.

The second central organic emission layer COL2 is disposed between the second central bottom electrode CBE2 and the second central top electrode CTE2 and has a second central thickness CT2 less than the first central thickness CT1. The second central organic emission layer COL2 comes into contact with the second central bottom electrode CBE2 and the second central top electrode CTE2. Since the second central organic emission layer COL2 comes into contact with the second central bottom electrode CBE2 and the second central top electrode CTE2 while having the second central thickness CT2, the distance between the second central bottom electrode CBE2 and the second central top electrode CTE2 along the virtual vertical line VVL corresponds to a second length L2 less than the first length L1. The second central OLED COLED2 is also disposed in the same central area 110 as the first central OLED COLED1 and is adjacent to the first central OLED COLED1. In this case, the bending of the first central OLED COLED1 and the second central OLED COLED2 is negligible. Thus, a line that is perpendicular to the second central bottom electrode CBE2 may be substantially parallel to the first vertical line VVL that is perpendicular to the first central bottom electrode CBE1. The second length L2 is a distance for causing micro cavity effect in light emitted from the second central organic emission layer COL2.

The second central organic emission layer COL2 emits green light and includes a second central assistant layer CAL2, a second central bottom organic layer CHL2, a second central main emission layer CEM2 and a second central top organic layer CEL2, which are sequentially laminated on the third central bottom electrode CBE3.

The second central assistant layer CAL2 may include a hole injection layer (HIL) for injecting holes from the second central bottom electrode CBE2 into the second central bottom organic layer CHL2 to serve as the hole injection layer and has a second central assistant thickness CA2 less than the first central assistant thickness CA1. Since the second central assistant layer CAL2 has the second central assistant thickness CA2, the second central organic emission layer COL2 has the second central thickness CT2. That is, the second central thickness CT2 of the second central organic emission layer COL2 can be controlled by adjusting the second central assistant thickness CA2 of the second central assistant layer CAL2.

The second central bottom organic layer CHL2 includes a hole injection layer (HIL), a hole transport layer (HTL) and a hole blocking layer (HBL).

The second central main emission layer CEM2 includes an emission layer that emits green light according to combination of holes and electrons respectively injected from the second central bottom electrode CBE2 and the second central top electrode CTE2.

The second central top organic layer CEL2 includes an electron injection layer (EIL), an electron transport layer (ETL) and an electron blocking layer (EBL).

Since the second central bottom electrode CBE2 of the second central OLED COLED2 is formed as a light reflective electrode, the second central top electrode CTE2 thereof is formed as transflective electrode and the distance between the second central bottom electrode CBE2 and the second central top electrode CTE2 corresponds to the second length L2, light emitted from the second central organic emission layer COL2 is reflected plural times between the second central bottom electrode CBE2 and the second central top electrode CTE2. Accordingly, constructive interference occurs in light emitted from the second central organic emission layer COL2, causing micro cavity effect in the light emitted from the second central organic emission layer COL2. That is, the second central OLED COLED2 emits light having micro cavity.

The third central OLED COLED3 is disposed on the central area 110 of the bent substrate 100 adjacent the second central OLED COLED2 and includes a third central bottom electrode CBE3, a third central top electrode CTE3 and a third central organic emission layer COL3.

The third central bottom electrode CBE3 is disposed on the bent substrate 100 and formed as a light reflective electrode. The third central bottom electrode CBE3 may contain a conductive material such as Ag, Al, ITO, IZO or the like and function as an anode of the third central OLED COLED3. The third central bottom electrode CBE3 is spaced apart from the second central bottom electrode CBE2.

The third central top electrode CTE3 is disposed opposite the third central bottom electrode CBE3 having the third central organic emission layer COL3 interposed therebetween and formed as a light reflective electrode. The third central top electrode CTE3 may contain a conductive material such as Ag, Al, ITO, IZO or the like and function as a cathode of the third central OLED COLED3. The third central top electrode CTE3 may be integrated with the second central top electrode CTE2.

The third central organic emission layer COL3 is disposed between the third central bottom electrode CBE3 and the third central top electrode CTE3 and has a third central thickness CT3 less than the second central thickness CT2. The third central organic emission layer COL3 comes into contact with the third central bottom electrode CBE3 and the third central top electrode CTE3. Since the third central organic emission layer COL3 comes into contact with the third central bottom electrode CBE3 and the third central top electrode CTE3 while having the third central thickness CT3, the distance between the third central bottom electrode CBE3 and the third central top electrode CTE3 along the virtual vertical line VVL corresponds to a third length L3 less than the second length L2. The third central OLED COLED3 is also disposed in the same central area 110 as the first and second central OLEDs COLED1 and COLED2 and is adjacent to the second central OLED COLED2. In this case, the bending of the first central OLED COLED1, the second central OLED COLED2, and the third central OLED COLED3 is negligible. Thus, a line that is perpendicular to the third central bottom electrode CBE3 may be substantially parallel to the first vertical line VVL that is perpendicular to the first central bottom electrode CBE1. The third length L3 is a distance for causing micro cavity effect in light emitted from the third central organic emission layer COL3.

The third central organic emission layer COL3 emits blue light and includes a third central assistant layer CAL3, a third central bottom organic layer CHL3, a third central main emission layer CEM3 and a third central top organic layer CELS, which are sequentially laminated on the third central bottom electrode CBE3.

The third central assistant layer CAL3 may include a hole injection layer for injecting holes from the third central bottom electrode CBE3 into the third central bottom organic layer CHL3 to function as the hole injection layer and have a third central assistant thickness CA3 less than the second central assistant thickness CA2. Since the third central assistant layer CAL3 has the third central assistant thickness CA3, the third central organic emission layer COL3 has the third central thickness CT3. That is, the third central thickness CT3 of the third central organic emission layer COL3 can be controlled by adjusting the third central assistant thickness CA3 of the third central assistant layer CAL3.

The third central bottom organic layer CHL3 includes a hole injection layer (HIL), a hole transport layer (HTL) and a hole blocking layer (HBL).

The third central main emission layer CEM3 includes an emission layer that emits blue light according to combination of holes and electrons respectively injected from the third central bottom electrode CBE3 and the third central top electrode CTE3.

The third central top organic layer CELS includes an electron injection layer (EIL), an electron transport layer (ETL) and an electron blocking layer (EBL).

Since the third central bottom electrode CBE3 of the third central OLED COLED3 is formed as a light reflective electrode and the third central top electrode CTE3 thereof is formed as a transflective electrode and the distance between the third central bottom electrode CBE3 and the third central top electrode CTE3 corresponds to the third length L3, light emitted from the third central organic emission layer COL3 is reflected plural times between the third central bottom electrode CBE3 and the third central top electrode CTE3. Accordingly, constructive interference occurs in light emitted from the third central organic emission layer COL3, causing micro cavity effect the light emitted from the third central organic emission layer COL3. That is, the third central OLED COLED3 emits light having micro cavity.

Figure 3:
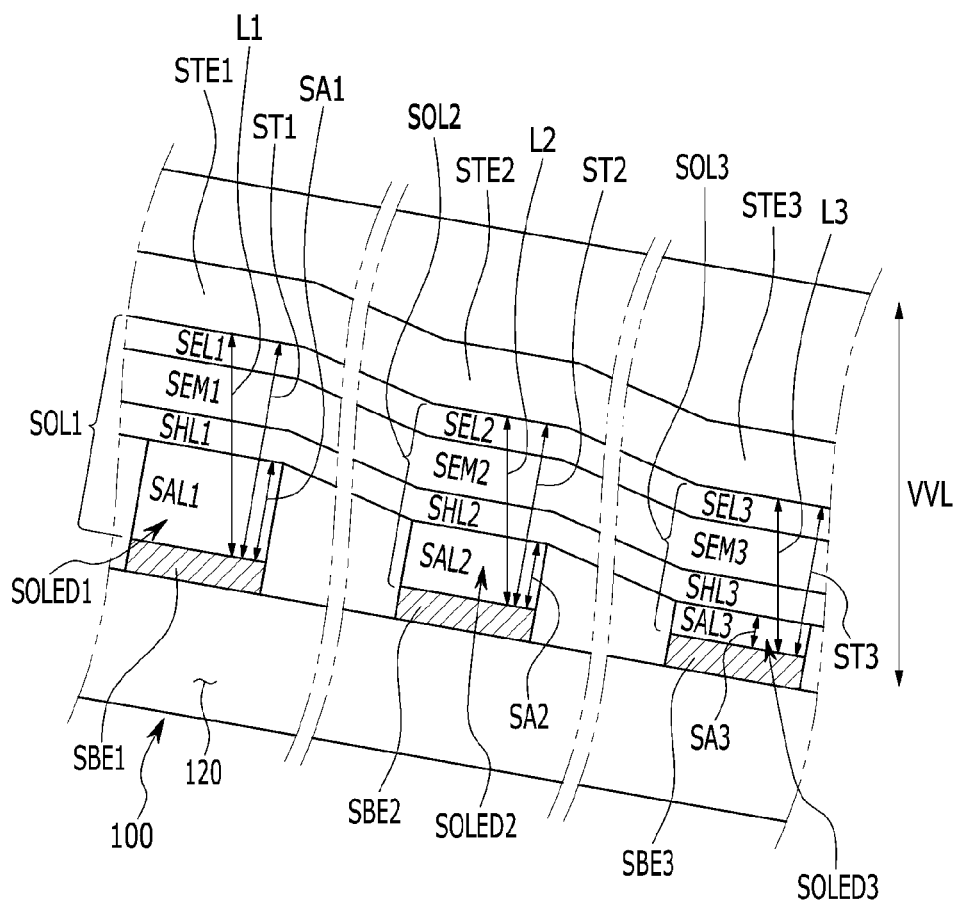
FIG. 3 is a cross-sectional view showing principal components of the OLED display according to the first embodiment, which correspond to region B of FIG. 1.

FIG. 3 is a cross-sectional view of components of the OLED display, which correspond to region B of FIG. 1, according to the first embodiment.

As shown in FIG. 3, the OLED display 1000 according to the first embodiment further includes a first surrounding OLED SOLED1, a second surrounding OLED SOLED2 and a third surrounding OLED SOLED3 disposed on the peripheral area 120 of the bent substrate 100. Since the first, second and third surrounding OLEDs SOLED1, SOLED2 and SOLED3 are located on the peripheral area 120 of the bent substrate 100, the first, second and third surrounding OLEDs SOLED1, SOLED2 and SOLED3 are tilted at a predetermined angle according to the curvature of the peripheral area 120 of the bent substrate 100.

The first surrounding OLED SOLED1 includes a first surrounding bottom electrode SBE1, a first surrounding top electrode STE1 and a first surrounding organic emission layer SOU.

The first surrounding bottom electrode SBE1 is disposed on the bent substrate 100 and formed as a light reflective electrode. The first surrounding bottom electrode SBE1 may contain a conductive material such as Ag, Al, ITO, IZO or the like and function as an anode of the first surrounding OLED SOLED1. The first surrounding bottom electrode SBE1 is disposed at the same level as the first central bottom electrode CBE1 and the first surrounding bottom electrode SBE1 and the first central bottom electrode CBE1 may be simultaneously formed.

The first surrounding top electrode STE1 is disposed opposite the first surrounding bottom electrode SBE1 having the surrounding organic emission layer SOL1 interposed therebetween and formed as a light transmissive electrode. The first surrounding top electrode STE1 may contain a conductive material such as Ag, Al, ITO, IZO or the like and function as a cathode of the first surrounding OLED SOLED1. The first surrounding top electrode STE1 is disposed at the same level as the first central top electrode CTE1 and the first surrounding top electrode STE1 and the first central top electrode CTE1 may be simultaneously formed. The first surrounding top electrode STE1 may be integrated with the first central top electrode CTE1.

In another embodiment, the first surrounding bottom electrode may be formed as a transflective electrode functioning as a cathode and the first surrounding top electrode may be formed as a light reflective electrode functioning as an anode.

The first surrounding organic emission layer SOL1 is disposed between the first surrounding bottom electrode SBE1 and the first surrounding top electrode STE1 and has a first surrounding thickness ST1 less than the first central thickness CT1. The first surrounding organic emission layer SOL1 comes into contact with the first surrounding bottom electrode SBE1 and the first surrounding top electrode STE1. Since the first surrounding organic emission layer SOL1 comes into contact with the first surrounding bottom electrode SBE1 and the first surrounding top electrode STE1 while having the first surrounding thickness ST1, the distance between the first surrounding bottom electrode SBE1 and the first surrounding top electrode STE1 along the virtual vertical line VVL corresponds to a first length L1. That is, the first length L1 between the first surrounding bottom electrode SBE1 and the first surrounding top electrode STE1 may correspond to the first length L1 between the first central bottom electrode CBE1 and the first central top electrode CTE1. As described above, the first length L1 is a distance for causing micro cavity effect in light emitted from the first surrounding organic emission layer SOU.

The first surrounding organic emission layer SOL1 emits red light like the first central organic emission layer COL1 and includes a first surrounding assistant layer SAL1, a first surrounding bottom organic layer SHL1, a first surrounding main emission layer SEM1 and a first surrounding top organic layer SEL1, which are sequentially laminated on the first surrounding bottom electrode SBE1.

While the first surrounding organic emission layer SOL1 emits red light in the first embodiment, the first surrounding organic emission layer SOL1 of an OLED display according to another embodiment may emit light having the same color as the light emitted from the first central organic emission layer, for example, green, blue or white light.

The first surrounding assistant layer SAL1 may include a hole injection layer for injecting holes from the first surrounding bottom electrode SBE1 into the first surrounding bottom organic layer SHL1 to serve as the hole injection layer and has a first surrounding assistant thickness SA1 less than the first central assistant thickness CA1 of the first central assistant layer CAL1. Since the first surrounding assistant layer SAL1 has the first surrounding assistant thickness SA1, the first surrounding organic emission layer SOL1 has the first surrounding thickness ST1 less than the first central thickness CT1. That is, the first surrounding thickness ST1 of the first surrounding organic emission layer SOL1 can be controlled by adjusting the first surrounding assistant thickness SA1 of the first surrounding assistant layer SAL1.

The first surrounding bottom organic layer SHL1 includes a hole injection layer (HIL), a hole transport layer (HTL) and a hole blocking layer (HBL).

The first surrounding main emission layer SEM1 includes an emission layer that emits red light in the same color as the light emitted from the first central main emission layer CEM1 according to combination of holes and electrons respectively injected from the first surrounding bottom electrode SBE1 and the first surrounding top electrode STE1.

The first surrounding top organic layer SEL1 includes an electron injection layer (EIL), an electron transport layer (ETL) and an electron blocking layer (EBL).

While the first surrounding assistant layer SAL1 includes the hole injection layer in the first embodiment, the first surrounding assistant layer SAL1 of an OLED display according to another embodiment may include one or more of a hole injection layer, a hole transport layer, a hole blocking layer, an electron injection layer, an electron transport layer and an electron blocking layer.

Since the first surrounding bottom electrode SBE1 of the first surrounding OLED SOLED1 is formed as a light reflective electrode, the first surrounding top electrode STE1 thereof is formed as a transflective electrode and the distance between the first surrounding bottom electrode SBE1 and the first surrounding top electrode STE1 corresponds to the first length L1 along the virtual vertical line VVL, light emitted from the first surrounding organic emission layer SOL1 is reflected plural times between the first surrounding bottom electrode SBE1 and the first surrounding top electrode STE1.

Accordingly, constructive interference occurs in light emitted from the first surrounding organic emission layer SOL1, causing micro cavity effect in the light emitted from the first surrounding organic emission layer SOL1. That is, the first surrounding OLED SOLED1 emits light having micro cavity.

The second surrounding OLED SOLED2 is disposed on the peripheral area 120 of the bent substrate 100 adjacent the first surrounding OLED SOLED1 and includes a second surrounding bottom electrode SBE2, a second surrounding top electrode STE2 and a second surrounding organic emission layer SOL2.

The second surrounding bottom electrode SBE2 is disposed on the bent substrate 100 and configured as a light reflective electrode. The second surrounding bottom electrode SBE2 may include a conductive material such as Ag, Al, ITO, IZO or the like and function as an anode of the second surrounding OLDE SOLED2. The second surrounding bottom electrode SBE2 is spaced apart from the first surrounding bottom electrode SBE1.

The second surrounding top electrode STE2 is disposed opposite the second surrounding bottom electrode SBE2 having the second surrounding organic emission layer SOL2 interposed therebetween and formed as a light transmissive electrode. The second surrounding top electrode STE2 may contain a conductive material such as Ag, Al, ITO, IZO or the like and function as a cathode of the second surrounding OLED SOLED2. The first surrounding top electrode STE1 is disposed at the same level as the first central top electrode CTE1 and the first surrounding top electrode STE1 and the first central top electrode CTE1 may be simultaneously formed. The second surrounding top electrode STE2 may be integrated with the second central top electrode CTE2.

The second surrounding organic emission layer SOL2 is disposed between the second surrounding bottom electrode SBE2 and the second surrounding top electrode STE2 and has a second surrounding thickness ST2 less than the first surrounding thickness ST1 and the second central thickness CT2. The second surrounding organic emission layer SOL2 comes into contact with the second surrounding bottom electrode SBE2 and the second surrounding top electrode STE2. Since the second surrounding organic emission layer SOL2 comes into contact with the second surrounding bottom electrode SBE2 and the second surrounding top electrode STE2 while having the second surrounding thickness ST2, the distance between the second surrounding bottom electrode SBE2 and the second surrounding top electrode STE2 corresponds to a second length L2 less than the first length L1. That is, the distance between the second surrounding bottom electrode SBE2 and the second surrounding top electrode STE2 corresponds to the second length L2 equal to the distance between the second central bottom electrode CBE2 and the second central top electrode CTE2. As described above, the second length L2 is a distance for causing micro cavity effect in light emitted from the second surrounding organic emission layer SOL2.

The second surrounding organic emission layer SOL2 emits green light in the same color as the light emitted from the second central organic emission layer COL2 and includes a second surrounding assistant layer SAL2, a second surrounding bottom organic layer SHL2, a second surrounding main emission layer SEM2 and a second surrounding top organic layer SEL2, which are sequentially laminated on the second surrounding bottom electrode SBE2.

The second surrounding assistant layer SAL2 may include a hole injection layer for injecting holes from the second surrounding bottom electrode SBE2 into the second surrounding bottom organic layer SHL2 to function as the hole injection layer and has a second surrounding assistant thickness SA2 less than the first surrounding assistant thickness SA1 and the second central assistant thickness CA2. Since the second surrounding assistant layer SAL2 has the second surrounding assistant thickness SA2, the second surrounding organic emission layer SOL2 has the second surrounding thickness ST2. That is, the second surrounding thickness ST2 of the second surrounding organic emission layer SOL2 can be controlled by adjusting the second surrounding assistant thickness SA2 of the second surrounding assistant layer SAL2.

The second surrounding bottom organic layer SHL2 includes a hole injection layer (HIL), a hole transport layer (HTL) and a hole blocking layer (HBL).

The second surrounding main emission layer SEM2 emits green light according to combination of holes and electrons respectively injected from the second surrounding bottom electrode SBE2 and the second surrounding top electrode STE2.

The second surrounding top organic layer SEL2 includes an electron injection layer (EIL), an electron transport layer (ETL) and an electron blocking layer (EBL).

Since the second surrounding bottom electrode SBE2 of the second surrounding OLED SOLED2 is formed as a light reflective electrode, the second surrounding top electrode STE2 thereof is formed as a transflective electrode and the distance between the second surrounding bottom electrode SBE2 and the second surrounding top electrode STE2 corresponds to the second length L2, light emitted from the second surrounding organic emission layer SOL2 is reflected plural times between the second surrounding bottom electrode SBE2 and the second surrounding top electrode STE2. Accordingly, constructive interference occurs in light emitted from the second surrounding organic emission layer SOL2, causing micro cavity effect in the light emitted from the second surrounding organic emission layer SOL2. That is, the second surrounding OLED SOLED2 emits light having micro cavity.

The third surrounding OLED SOLED3 is disposed on the peripheral area 120 of the bent substrate 100 adjacent the second surrounding OLED SOLED2 and includes a third surrounding bottom electrode SBE3, a third surrounding top electrode STE3 and a third surrounding organic emission layer SOL3.

The third surrounding bottom electrode SBE3 is disposed on the bent substrate 100 and configured as a light reflective electrode. The third surrounding bottom electrode SBE3 may include a conductive material such as Ag, Al, ITO, IZO or the like and function as an anode of the third surrounding OLED SOLED3. The third surrounding bottom electrode SBE3 is spaced apart from the second surrounding bottom electrode SBE2.

The third surrounding top electrode STE3 is disposed opposite the third surrounding bottom electrode SBE3 having the third surrounding organic emission layer SOL3 interposed therebetween and formed as a light transmissive electrode. The third surrounding top electrode STE3 may include a conductive material such as Ag, Al, ITO, IZO or the like and function as a cathode of the third surrounding OLED SOLED3. The third surrounding top electrode STE3 may be integrated with the second surrounding top electrode STE2.

The third surrounding organic emission layer SOL3 is disposed between the third surrounding bottom electrode SBE3 and the third surrounding top electrode STE3 and has a third surrounding thickness ST3 less than the second surrounding thickness ST2 and the third central thickness CT3. The third surrounding organic emission layer SOL3 comes into contact with the third surrounding bottom electrode SBE3 and the third surrounding top electrode STE3. Since the third surrounding organic emission layer SOL3 comes into contact with the third surrounding bottom electrode SBE3 and the third surrounding top electrode STE3 while having the third surrounding thickness ST3, the distance between the third surrounding bottom electrode SBE3 and the third surrounding top electrode STE3 corresponds to a third length L3. That is, the distance between the third surrounding bottom electrode SBE3 and the third surrounding top electrode STE3 corresponds to the third length L3 equal to the distance between the third central bottom electrode CBE3 and the third central top electrode CTE3. As described above, the third length L3 is a distance for causing micro cavity effect in light emitted from the third surrounding organic emission layer SOL3.

The third surrounding organic emission layer SOL3 emits blue light in the same color as the light emitted from the third central organic emission layer COLS and includes a third surrounding assistant layer SAL3, a third surrounding bottom organic layer SHL3, a third surrounding main emission layer SEM3 and a third surrounding top organic layer SEL3.

The third surrounding assistant layer SAL3 includes a hole injection layer for injecting holes from the third surrounding bottom electrode SBE3 into the third surrounding bottom organic layer SHL3 to function as the hole injection layer and has a third surrounding assistant thickness SA3 less than the second surrounding assistant thickness SA2 and the third central assistant thickness CA3. Since the third surrounding assistant layer SAL3 has the third surrounding assistant thickness SA3, the third surrounding organic emission layer SOL3 has the third surrounding thickness ST3. That is, the third surrounding thickness ST3 of the third surrounding organic emission layer SOL3 can be controlled by adjusting the third surrounding assistant thickness SA3 of the third surrounding assistant layer SAL3.

The third surrounding bottom organic layer SHL3 includes a hole injection layer (HIL), a hole transport layer (HTL) and a hole blocking layer (HBL).

The third surrounding main emission layer SEM3 includes an emission layer that emits blue light according to combination of holes and electrons respectively injected from the third surrounding bottom electrode SBE3 and the third surrounding top electrode STE3.

The third surrounding top organic layer SEL3 includes an electron injection layer (EIL), an electron transport layer (ETL) and an electron blocking layer (EBL).

Since the third surrounding bottom electrode SBE2 of the third surrounding OLED SOLED3 is formed as a light reflective electrode, the third surrounding top electrode STE3 thereof is formed as a transflective electrode and the distance between the third surrounding bottom electrode SBE3 and the third surrounding top electrode STE3 corresponds to the third length L3, light emitted from the third surrounding organic emission layer SOL3 is reflected plural times between the third surrounding bottom electrode SBE3 and the third surrounding top electrode STE3. Accordingly, constructive interference occurs in light emitted from the third surrounding organic emission layer SOL3, causing micro cavity effect in the light emitted from the third surrounding organic emission layer SOL3. That is, the third surrounding OLED SOLED3 emits light having micro cavity.

While the first central OLED COLED1 is disposed on the central area 110 of the bent substrate 100 and the first surrounding OLED SOLED1 is disposed on the peripheral area 120 of the bent substrate 100 in the OLED display 1000 according to the first embodiment, an OLED display according to another embodiment may include a plurality of OLEDs disposed over the central area to the peripheral area of the bent substrate and the plurality of OLEDs may include organic emission layers having thicknesses that gradually decrease in such a manner that an organic emission layer disposed on the central area is thicker than an organic emission layer disposed on the peripheral area according to the curvature of the bent substrate. The organic emission layers included in the plurality of OLEDs may emit lights of the same color.

As described above, in the OLED display 1000 according to the first embodiment, the distance between the first surrounding bottom electrode SBE1 and the first surrounding top electrode STE1 of the first surrounding OLED SOLED1 along the virtual vertical line VVL corresponds to the first length L1 equal to the distance between the first central bottom electrode CBE1 and the first central top electrode CTE1 of the first central OLED COLED1 since the first surrounding OLED SOLED1 includes the first surrounding organic emission layer SOL1 having the first surrounding thickness ST1 less than the first central thickness CT1 of the first central organic emission layer COL1 even if the first surrounding OLED SOLED1 is disposed on the peripheral area 120 of the bent substrate 100 and thus is tilted according to the curvature of the bent substrate 100. Accordingly, lights emitted from the first central OLED COLED1 and the first surrounding OLED SOLED1 are recognized as having the same wavelength when viewed from the front of the bent substrate 100.

That is, even though the substrate 100 of the OLED display 1000 is bent, lights emitted from the central area 110 and the peripheral area 120 of the bent substrate 100 are recognized as lights of a correct color.

Furthermore, even if the OLED display 1000 according to the first exemplary embodiment includes the bent substrate 100, micro cavity effect for red is implemented in the first central OLED COLED1 and the first surrounding OLED SOLED1, micro cavity effect for green is implemented in the second central OLED COLED2 and the second surrounding OLED SOLED2 and micro cavity effect for blue is implemented in the third central OLED COLED3 and the third surrounding OLED SOLED3, and thus color reproduction accuracy is improved. That is, the OLED display 1000 can display improved images.

An OLED display according to a second embodiment will now be described with reference to FIGS. 4, 5 and 6.

Only parts distinguished from the first embodiment are described in the following and parts of the second embodiment, which are not described, conform to corresponding parts of the first embodiment. The same reference numbers will be used throughout the first and second embodiments to refer to the same or like parts.

Figure 4:
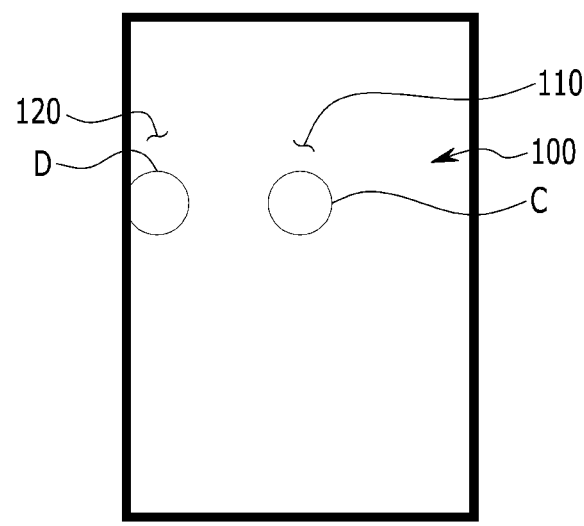
FIG. 4 illustrates an OLED display constructed as a second embodiment according to the principles of the present invention.
Figure 4:
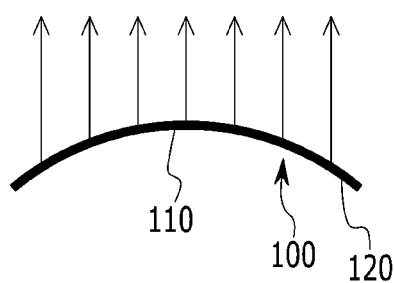

FIG. 4 illustrates an OLED display 1002 according to the second exemplary embodiment. FIG. 4(a) is a top plan view of the OLED display 1002 and FIG. 4(b) is a side view of the OLED display 1002.

As shown in FIG. 4, the OLED display 1002 according to the second embodiment includes the bent substrate 100 and a plurality of OLEDs formed on the bent substrate 100.

The bent substrate 100 includes the central area 110 and the peripheral area 120 in the neighboring with the central area 110 and has a shape bent at the center thereof. The substrate 100 is bent in a convex form and thus the central area 110 is located higher than the peripheral area 120.

Figure 5:
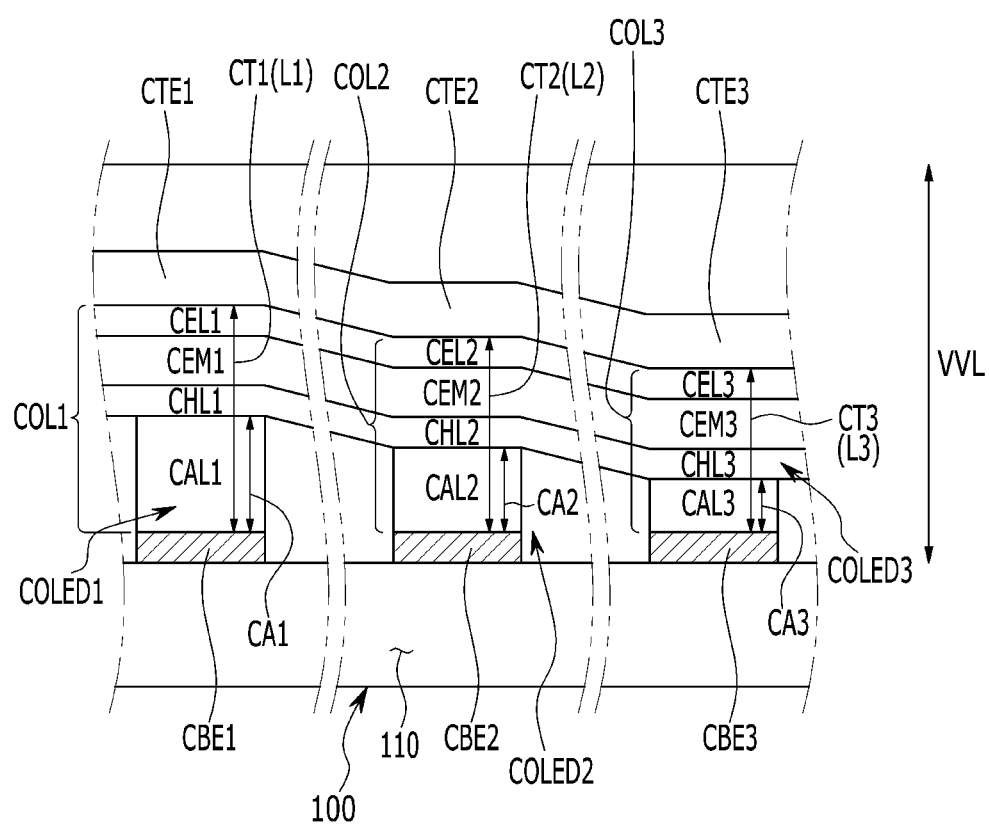
FIG. 5 is a cross-sectional view showing principal components of the OLED display according to the second embodiment, which correspond to region C of FIG. 4.

FIG. 5 is a cross-sectional view of components of the OLED display, which correspond to region C of FIG. 4, according to the second embodiment. FIG. 6 is a cross-sectional view of components of the OLED display, which correspond to region D of FIG. 4, according to the second embodiment.

Figure 6:
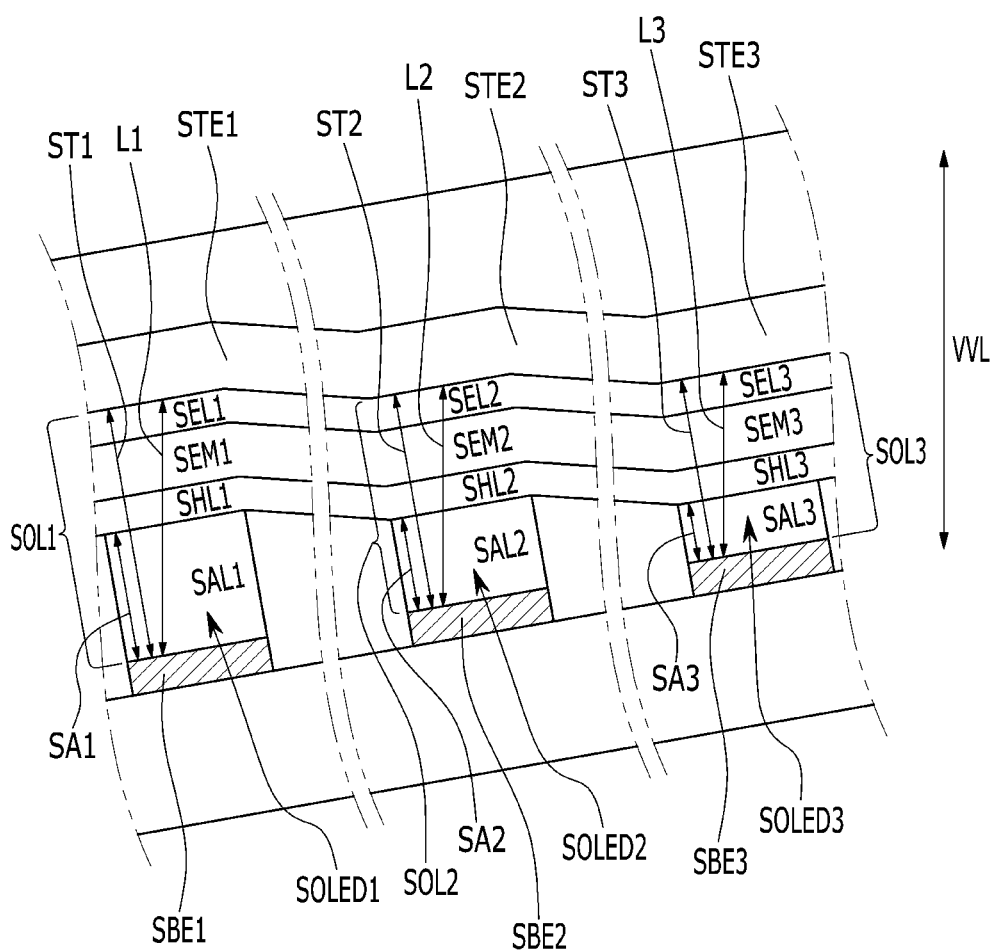
FIG. 6 is a cross-sectional view showing principal components of the OLED display according to the second embodiment, which correspond to region D of FIG. 4.

As shown in FIGS. 5 and 6, the OLED display 1002 according to the second embodiment includes the first, second and third central OLEDs COLED1, COLED2 and COLED3 disposed on the central area 110 of the bent substrate 100 and the first, second and third surrounding OLEDs SOLED1, SOLED2 and SOLED3 disposed on the peripheral area 120 of the bent substrate 100.

The first central organic emission layer COL1, the second central organic emission layer COL2, the third central organic emission layer COLS, the first surrounding organic emission layer SOLE the second surrounding organic emission layer SOL2 and the third surrounding organic emission layer SOLS emit white light.

The distance between the first central bottom electrode CBE1 and the first central top electrode CTE1 and the distance between the first surrounding bottom electrode SBE1 and the first surrounding top electrode STE1 along the virtual vertical line VVL correspond to the first length L1. Here, the first length L1 is a distance for causing micro cavity effect in lights emitted from the first central organic emission layer COL1 and the first surrounding organic emission layer SOL1 to change white light emitted by the emission layers into red light.

Accordingly, both the first central OLED COLED1 and the first surrounding OLED SOLED1 emit red light.

The distance between the second central bottom electrode CBE2 and the second central top electrode CTE2 and the distance between the second surrounding bottom electrode SBE2 and the second surrounding top electrode STE2 along the virtual vertical line VVL correspond to the second length L2. Here, the second length L2 is a distance for causing micro cavity effect in lights emitted from the second central organic emission layer COL2 and the second surrounding organic emission layer SOL2 to change white lights emitted from the emission layers to green lights.

Accordingly, both the second central OLED COLED2 and the second surrounding OLED SOLED2 emit green light.

The distance between the third central bottom electrode CBE3 and the third central top electrode CTE3 and the distance between the third surrounding bottom electrode SBE3 and the third surrounding top electrode STE3 along the virtual vertical line VVL correspond to the third length L3. Here, the third length L3 is a distance for causing micro cavity effect in lights emitted from the third central organic emission layer COL3 and the third surrounding organic emission layer SOL3 to change white lights emitted from the emission layers to blue lights.

Accordingly, both the third central OLED COLED3 and the third surrounding OLED SOLED3 emit blue light.

As described above, in the OLED display 1002 according to the second embodiment, the distance between the first surrounding bottom electrode SBE1 and the first surrounding top electrode STE1 of the first surrounding OLED SOLED1 along the virtual vertical line VVL corresponds to the first length L1 equal to the distance between the first central bottom electrode CBE1 and the first central top electrode CTE1 of the first central OLED COLED1 since the first surrounding OLED SOLED1 includes the first surrounding organic emission layer SOL1 having the first surrounding thickness ST1 less than the first central thickness CT1 of the first central organic emission layer COL1 even if the first surrounding OLED SOLED1 is disposed on the peripheral area 120 of the bent substrate 100 and thus is tilted according to the curvature of the bent substrate 100. Accordingly, lights emitted from the first central OLED COLED1 and the first surrounding OLED SOLED1 are recognized as having the same wavelength when viewed from the front of the bent substrate 100.

That is, even though the substrate 100 of the OLED display 1002 is bent, lights emitted from the central area 110 and the peripheral area 120 of the bent substrate 100 are recognized as lights having a correct color.

In the OLED display 1002 according to the second embodiment, since the first, second and third central organic emission layers COL1, COL2 and COL3 and the first, second and third surrounding organic emission layers SOLE SOL2 and SOL3 emit white light, the first, second and third central organic emission layers COL1, COL2 and COLS and the first, second and third surrounding organic emission layers SOL1, SOL2 and SOLS can be integrated. That is, manufacturing efficiency of the OLED display 1002 is improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising a first central OLED and a first surrounding OLED respectively disposed in a central area and a peripheral area of a bent substrate, a thickness of an first surrounding organic emission layer of the first surrounding OLED being less than a thickness of a first central organic emission layer of the first central OLED, the first central OLED and the first surrounding OLED emitting light having a same first color.

2. The OLED display device of claim 1, wherein the first central OLED further includes a first central bottom electrode and a first central top electrode facing each other and disposed on opposite sides of the first central organic emission layer, and the first surrounding OLED further includes a first surrounding bottom electrode and a first surrounding top electrode facing each other and disposed on opposite sides of the first surrounding organic emission layer.

3. The OLED display device of claim 2, wherein a distance between the first central bottom electrode and the first central top electrode along a virtual vertical line perpendicular to the first central bottom electrode is identical to a distance between the first surrounding bottom electrode and the first surrounding top electrode along a line parallel to the virtual vertical line.

4. The OLED display device of claim 2, wherein the first central bottom electrode and the first surrounding bottom electrode are light reflective and the first central top electrode and the surrounding top electrode are transflective.

5. The OLED display device of claim 2, wherein the first central top electrode and the surrounding top electrode are integrated with each other.

6. The OLED display device of claim 2, wherein the first central bottom electrode and the first central top electrode come into contact with the first central organic emission layer and the first surrounding bottom electrode and the surrounding top electrode come into contact with the first surrounding organic emission layer.

7. The OLED display device of claim 1, wherein the first central organic emission layer includes a central assistant layer, the first surrounding organic emission layer includes a surrounding assistant layer, and a thickness of the surrounding assistant layer is less than a thickness of the central assistant layer.

8. The OLED display device of claim 7, wherein each of the central assistant layer and the surrounding assistant layer includes one or more of a hole injection layer, a hole transport layer, a hole blocking layer, an electron transport layer, an electron injection layer and an electron blocking layer.

9. The OLED display device of claim 1, further comprising:
- a second central OLED neighboring the first central OLED and including a second central organic emission layer, a thickness of the second central organic emission layer being less than the thickness of the first central organic emission layer;
- a third central OLED neighboring the second central OLED and including a third central organic emission layer, a thickness of the third central organic emission layer being less than the thickness of the second central organic emission layer;
- a second surrounding OLED neighboring the first surrounding OLED and including a second surrounding organic emission layer, a thickness of second surrounding organic emission layer being less than the thickness of the first surrounding organic emission layer, the second surrounding OLED and the second central OLED emitting light having a same second color; and
- a third surrounding OLED neighboring the second surrounding OLED and including a third surrounding organic emission layer, a thickness of third surrounding organic emission layer being less than the thickness of the second surrounding organic emission layer, the third surrounding OLED and the third central OLED emitting light having a same third color.

10. The OLED display device of claim 9, wherein the first central organic emission layer and the first surrounding organic emission layer emit red light, the second central organic emission layer and the second surrounding organic emission layer emit green light, and the third central organic emission layer and the third surrounding organic emission layer emit blue light.

11. The OLED display device of claim 9, wherein the first color, the second color, and the third color are white color.

12. The OLED display device of claim 11, wherein the first color is red color, the second color is green color, and the third color is blue color.

13. The OLED display device of claim 1, wherein the peripheral area is spaced apart from a tangent plane of the bent substrate that has a point of tangency located in the center area.

14. An organic light emitting diode (OLED) display device, comprising:
- a substrate including a central area and a peripheral area adjacent the central area and bent at a center of the substrate; and
- a plurality of OLEDs disposed on the bent substrate over the central area to the peripheral area and including organic emission layers having thicknesses gradually decreasing such that an OLED disposed in the central area is thicker than an OLED disposed in the peripheral area.

15. The OLED display device of claim 14, wherein the organic emission layers included in the plurality of OLEDs emit light having a same color.

* * * * *